United States Patent
Conzatti et al.

(10) Patent No.: US 10,594,330 B2
(45) Date of Patent: Mar. 17, 2020

(54) OFFSET SYSTEM AND METHOD FOR MULTI-BIT DIGITAL-TO-ANALOG CONVERTERS

(71) Applicant: Intel Corporation, Santa Clara, CA (US)

(72) Inventors: Francesco Conzatti, Villach (AT); Patrick Torta, Villach (AT); Lukas Doerrer, Villach (AT); Marco Bresciani, Villach (AT); Claus Kropf, Villach (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/349,390

(22) PCT Filed: Sep. 29, 2017

(86) PCT No.: PCT/US2017/054329
§ 371 (c)(1),
(2) Date: May 13, 2019

(87) PCT Pub. No.: WO2018/136120
PCT Pub. Date: Jul. 26, 2018

(65) Prior Publication Data
US 2019/0341923 A1 Nov. 7, 2019

Related U.S. Application Data

(60) Provisional application No. 62/448,651, filed on Jan. 20, 2017.

(51) Int. Cl.
*H03M 1/06* (2006.01)
*H03M 3/00* (2006.01)

(52) U.S. Cl.
CPC ......... *H03M 1/0607* (2013.01); *H03M 3/356* (2013.01); *H03M 3/464* (2013.01)

(58) Field of Classification Search
CPC .... H03M 1/0607; H03M 3/464; H03M 3/356; H03M 1/12; H03M 1/66; H03M 1/06; H03M 1/1023
USPC .................................................. 341/118, 144
See application file for complete search history.

(56) References Cited

U.S. PATENT DOCUMENTS

| | | | |
|---|---|---|---|
| 4,598,269 A * | 7/1986 | Penney | G06J 1/00 341/118 |
| 4,743,885 A | 5/1988 | Kobayashi et al. | |
| 5,198,814 A * | 3/1993 | Ogawara | H03M 1/1047 341/118 |
| 6,249,269 B1 | 6/2001 | Blalock et al. | |

(Continued)

OTHER PUBLICATIONS

PCT International Search Authority, PCT Search Report issued for PCT/2017/0543229, 2 pgs., dated Dec. 15, 2017.

*Primary Examiner* — Jean B Jeanglaude
(74) *Attorney, Agent, or Firm* — Eschweiler & Potashnik, LLC

(57) ABSTRACT

Methods adapted for digital-to-analog conversion compensation and systems are described. In a compensation method, inputs of a digital-to-analog converter (DAC) are adjusted to provide an even number inputs for the DAC. Further, one or more analog input signals are converted to generate one or more corresponding digital output signals. The one or more digital output signals are compensated to compensate for the adjustment of the inputs of the DAC.

22 Claims, 16 Drawing Sheets

(56) References Cited

U.S. PATENT DOCUMENTS

| | | | |
|---|---|---|---|
| 6,987,473 B1* | 1/2006 | Nussbaum | H03M 3/508 |
| | | | 341/143 |
| 7,317,413 B2* | 1/2008 | Lee | H03M 1/662 |
| | | | 341/141 |
| 7,528,752 B1 | 5/2009 | Chern | |
| 8,736,478 B2 | 5/2014 | Bailey et al. | |
| 9,088,293 B1 | 7/2015 | D'Souza et al. | |
| 2002/0085647 A1 | 7/2002 | Oishi et al. | |
| 2006/0022856 A1* | 2/2006 | Choe | H03M 1/0881 |
| | | | 341/144 |
| 2006/0250289 A1 | 11/2006 | Tsuchi | |
| 2007/0040720 A1 | 2/2007 | Kim | |
| 2009/0128382 A1 | 5/2009 | Matsukawa et al. | |
| 2015/0236655 A1* | 8/2015 | Hirose | H03F 1/0211 |
| | | | 330/297 |
| 2016/0226509 A1 | 8/2016 | Pagnanelli | |
| 2016/0365867 A1 | 12/2016 | Kauffman et al. | |

* cited by examiner

| QT code | DAC cell (Differential 4-bit DAC) 0-15 | Ioutp | Idiff |
|---|---|---|---|
| 0 | | -15 | -30 |
| 1 | | -13 | -26 |
| 2 | | -11 | -22 |
| 3 | | -9 | -18 |
| 4 | | -7 | -14 |
| 5 | | -5 | -10 |
| 6 | | -3 | -6 |
| 7 | | -1 | -2 |
| 8 | | 1 | 2 |
| 9 | | 3 | 6 |
| 10 | | 5 | 10 |
| 11 | | 7 | 14 |
| 12 | | 9 | 18 |
| 13 | | 11 | 22 |
| 14 | | 13 | 26 |
| 15 | | 15 | 30 |

FIG. 4A

| QT code | Ip | In | dump ing | Ofs | Ioutp | Idiff |
|---|---|---|---|---|---|---|
| 0 | 0 | 7 | 1 | -1 | -15 | -30 |
| 1 | 0 | 6 | 2 | -1 | -13 | -26 |
| 2 | 0 | 5 | 3 | -1 | -11 | -22 |
| 3 | 0 | 4 | 4 | -1 | -9 | -18 |
| 4 | 0 | 3 | 5 | -1 | -7 | -14 |
| 5 | 0 | 2 | 6 | -1 | -5 | -10 |
| 6 | 0 | 1 | 7 | -1 | -3 | -6 |
| 7 | 0 | 0 | 8 | -1 | -1 | -2 |
| 8 | 1 | 0 | 7 | -1 | 1 | 2 |
| 9 | 2 | 0 | 6 | -1 | 3 | 6 |
| 10 | 3 | 0 | 5 | -1 | 5 | 10 |
| 11 | 4 | 0 | 4 | -1 | 7 | 14 |
| 12 | 5 | 0 | 3 | -1 | 9 | 18 |
| 13 | 6 | 0 | 2 | -1 | 11 | 22 |
| 14 | 7 | 0 | 1 | -1 | 13 | 26 |
| 15 | 8 | 0 | 0 | -1 | 15 | 30 | differential 4-bit DAC

| QT code | DAC 14 | 13 | 12 | 11 | 10 | 9 | 8 | 7 | cell tieo | 0 | 1 | 2 | 3 | 4 | 5 | 6 | Ioffs |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | -1 |
| 1 | 0 | 0 | 0 | 0 | 0 | 0 | 0 | 0 | 0 | 0 | 0 | 0 | 0 | 0 | 0 | 2 | -1 |
| 2 | 0 | 0 | 0 | 0 | 0 | 0 | 0 | 0 | 0 | 0 | 0 | 0 | 0 | 0 | 2 | 2 | -1 |
| 3 | 0 | 0 | 0 | 0 | 0 | 0 | 0 | 0 | 0 | 0 | 0 | 0 | 0 | 2 | 2 | 2 | -1 |
| 4 | 0 | 0 | 0 | 0 | 0 | 0 | 0 | 0 | 0 | 0 | 0 | 0 | 2 | 2 | 2 | 2 | -1 |
| 5 | 0 | 0 | 0 | 0 | 0 | 0 | 0 | 0 | 0 | 0 | 0 | 2 | 2 | 2 | 2 | 2 | -1 |
| 6 | 0 | 0 | 0 | 0 | 0 | 0 | 0 | 0 | 0 | 0 | 2 | 2 | 2 | 2 | 2 | 2 | -1 |
| 7 | 0 | 0 | 0 | 0 | 0 | 0 | 0 | 0 | 0 | 2 | 2 | 2 | 2 | 2 | 2 | 2 | -1 |
| 8 | -2 | -2 | -2 | -2 | -2 | -2 | -2 | 0 | 2 | 2 | 2 | 2 | 2 | 2 | 2 | 2 | -1 |
| 9 | -2 | -2 | -2 | -2 | -2 | -2 | 0 | 0 | 0 | 2 | 2 | 2 | 2 | 2 | 2 | 2 | -1 |
| 10 | -2 | -2 | -2 | -2 | -2 | 0 | 0 | 0 | 0 | 0 | 2 | 2 | 2 | 2 | 2 | 2 | -1 |
| 11 | -2 | -2 | -2 | -2 | 0 | 0 | 0 | 0 | 0 | 0 | 0 | 2 | 2 | 2 | 2 | 2 | -1 |
| 12 | -2 | -2 | -2 | 0 | 0 | 0 | 0 | 0 | 0 | 0 | 0 | 0 | 2 | 2 | 2 | 2 | -1 |
| 13 | -2 | -2 | 0 | 0 | 0 | 0 | 0 | 0 | 0 | 0 | 0 | 0 | 0 | 2 | 2 | 2 | -1 |
| 14 | -2 | 0 | 0 | 0 | 0 | 0 | 0 | 0 | 0 | 0 | 0 | 0 | 0 | 0 | 2 | 2 | -1 |
| 15 | 0 | 0 | 0 | 0 | 0 | 0 | 0 | 0 | 0 | 0 | 0 | 0 | 0 | 0 | 0 | 2 | -1 |

FIG. 4B

OFFSET SYSTEM AND METHOD FOR MULTI-BIT DIGITAL-TO-ANALOG CONVERTERS

CROSS REFERENCE TO RELATED APPLICATIONS

This patent application claims the benefit of U.S. Provisional Patent Application No. 62/448,651, filed Jan. 20, 2017, entitled "OFFSET TECHNIQUE FOR MULTI-BIT DIGITAL-TO-ANALOG CONVERTERS," which is incorporated herein by reference in its entirety.

BACKGROUND

Field

Aspects described herein generally relate to digital signal processing, including digital-to-analog conversion and Multi-bit Digital-to-Analog Converters (DAC) system and methods.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 4A illustrates an input/output matrix of a digital-to-analog conversion system according to an exemplary aspect of the present disclosure.

FIG. 4B illustrates an input/output matrix of a compensated digital-to-analog conversion system according to an exemplary aspect of the present disclosure.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

As an overview, Digital-to-Analog Converters (DAC) are typically used in signal processing, including the signal processing in communication systems. In one or more exemplary aspects, a communication transceiver can include one or more multi-bit DACs for signal processing of transmitted and/or received communications. However, the present disclosure is not limited to applications of the DAC compensation system and methods in communication devices and can be implemented in other devices having one or more DACs.

Figure 1:
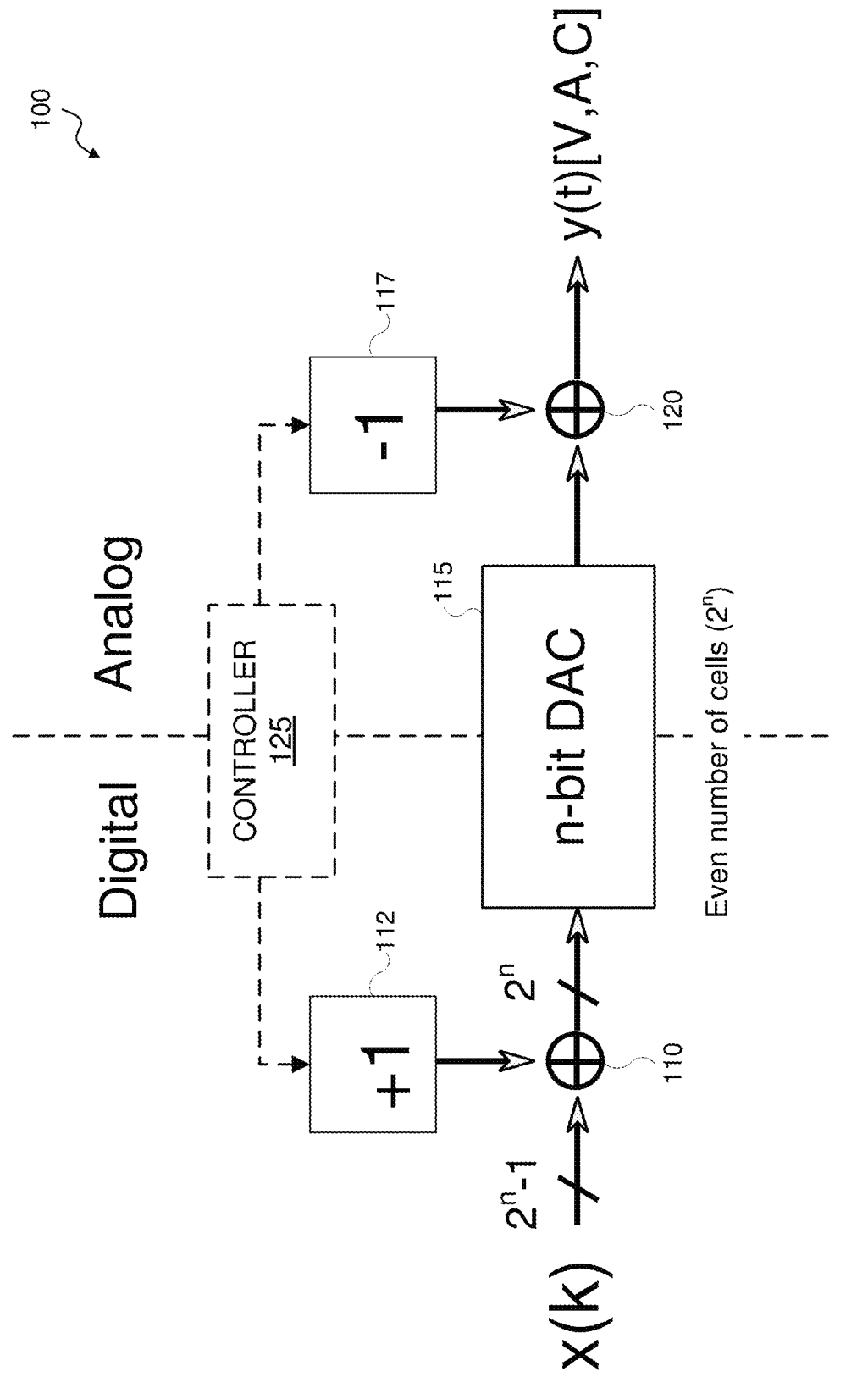
FIG. 1 illustrates a digital-to-analog conversion system according to an exemplary aspect of the present disclosure.

In an exemplary aspect, the digital input signals of a multi-bit DAC and/or the analog output signals of the DAC can be compensated. For example, as illustrated in FIG. 1, in a system 100 having an odd number of input signals (e.g., $2^n-1$ signals) x(k), the input signals x(k) can be adjusted such that the input signals become an even number of signals (e.g., $2^n$ signals). In an exemplary aspect, the output signals y(t) can then be adjusted (or otherwise compensated) to compensate for the adjustment to the input signals x(k). In this example, the n-bit DAC 115 includes an even number of cells (e.g., $2^n$ cells). The system 100 can be, for example, a communication device, such as a mobile communication device (e.g., a transceiver of a mobile device), but is not limited thereto.

In an exemplary aspect, the input signals (e.g., $2^n-1$ signals) x(k) can be adjusted by an offset value 112 (e.g., +1) while the analog output signal is adjusted/compensated by corresponding offset value 117 (e.g., −1) to compensate and account for the offset (e.g., +1) to the digital input signals. In this example, the system can include a mixer 110 (e.g., adder) that is configured to add the offset value 112 (e.g., +1) with the input signal x(k) (e.g., $1+2^n-1=2^n$). Similarly, the output path can include a mixer 120 (e.g., adder) that is configured to add the offset value 117 (e.g., −1) with the analog output signal of the DAC 115 to compensate for the adjustment to the digital input signal at the input of the DAC 115. In this example, the DAC 115 is a n-bit DAC (i.e., a DAC with an even number of cells $2^n$) even in a configuration having an odd number of input signals x(k) due to the adjustment and compensation of the input and output signals by the offset values 112 and 117, respectively. With an even number of cells, the matching of the DAC 115 is advantageously improved as well as the design complexity of the system 100 can be reduced by allowing for an even cell DAC configuration. The offset values 112, 117 can be fixed values or can be dynamically adjusted. Further, the values of the offset values 112 and/or 117 are not limited to the value of +1/−1, and can be another values (e.g. any integer or real value) as would be understood by one of ordinary skill in the relevant arts. In an exemplary aspect, the system 100 includes a controller 125 that is configured to set and/or dynamically adjust the offset values 112, 117. As illustrated in FIG. 1, the controller 125 spans both the digital domain and the analog domain, but is not limited thereto (e.g., the controller 125 can include digital components, analog components, or a combination of both digital and analog components). In this example, the controller 125 can be configured to generate a digital signal to set and/or adjust the offset 112 and/or an analog signal to set and/or adjust the offset 117. The controller 125 can include processor circuitry that is configured to perform one or more operations and/or functions of the control 125, including setting and/or adjusting the offset values 112, 117. In an exemplary aspect, the offsets 112, 117 can be predetermined and set during the manufacturing process of the system 100. In this example, the system 100 may omit the controller 125.

In an exemplary aspect, a multi-bit DAC 115 (e.g., a fully thermometer DAC) can be generally driven by an odd number of digital signals. By performing one or more pre-conditioning operations of the DAC input signal (e.g., adjusting and compensating as shown in FIG. 1), the number of digital inputs (e.g., wires/connections) driving the DAC becomes even. As illustrated in FIG. 1, the total number of cells within the DAC 115 also becomes even, which in turn greatly simplifies its implementation. Further, current dumping can be used to significantly reduce the output noise of the DAC 115.

With continued reference to FIG. 1, in an exemplary aspect, the n-bit DAC 115 is driven by a digital bus x(k), composed of an odd number of connections/inputs (e.g., $2^n-1$ signals). A digital offset value 112 (e.g., +1) is added to x(k) via mixer 110 to generate an output of $2^n$ (i.e., even) digital signals that are input to the DAC 115. The DAC 115 can then be configured (or otherwise realized) with an even number ($2^n$) of cells. With an even-number cell configuration, layout and circuit implementation complexity can be advantageously reduced.

After the digital-to-analog conversion by the DAC 115, the analog quantity corresponding to a digital offset value 117 of, for example, 1 is subtracted from (or the value of "−1" is added to) the output of the DAC 115 to compensate for the pre-conversion adjustment to restore the output of the DAC 115 to the intended output signal. In this example, the offset 117 is configured to output an analog output value that corresponds to the digital offset value output by the offset 112. The offsets 112, 117 can be configured to generate and output their corresponding offset values in one or more aspects. In an exemplary aspect, the offsets 112, 117 can include one or more voltage and/or current sources that are configured to generate a voltage/current value corresponding to the respective offset generated by the offsets 112, 117.

In an exemplary aspect, the post-conversion adjustment is performed within the DAC 115 during the digital-to-analog conversion process. In this example, the mixer 120, offset 117, and/or other compensation device can be included within the DAC 115 to provide the offset value 117 to compensate for the pre-conversion adjustment. For example, the mixer 117 can be included within the DAC 115 that receives an externally and/or internally generated offset value (e.g. from offset 117). Additionally or alternatively, in an exemplary aspect, the pre-conversion adjustment is performed within the DAC 115 during the digital-to-analog conversion process. In this example, the mixer 110, offset 112, and/or or other compensation device can be included within the DAC 115 to provide the offset value 112 to adjust the inputs of the DAC 115 to provide an even number of digital input signals that are converted by the DAC 115.

The adjustment and compensation of the input and output signals of the DAC 115 are independent of the type of DAC being used, and the DAC 115 can be, for example, a voltage converter, a current converter, a charge (capacitive) converter, or other converter as would be understood by one of ordinary skill in the relevant arts. In one or more exemplary aspects, one or more of the components of the system 100 include processor circuitry configured to perform one or more operations and/or functions of the corresponding component(s). For example, the mixer 110 and/or mixer 120 can include processor circuitry configured to mix two input signals to generate an output signal. Similarly, the offset 112 and/or offset 117 can include processor circuitry that is configured to generate respective offset values (e.g., based on one or more control signals from the controller 125).

Figure 2A:
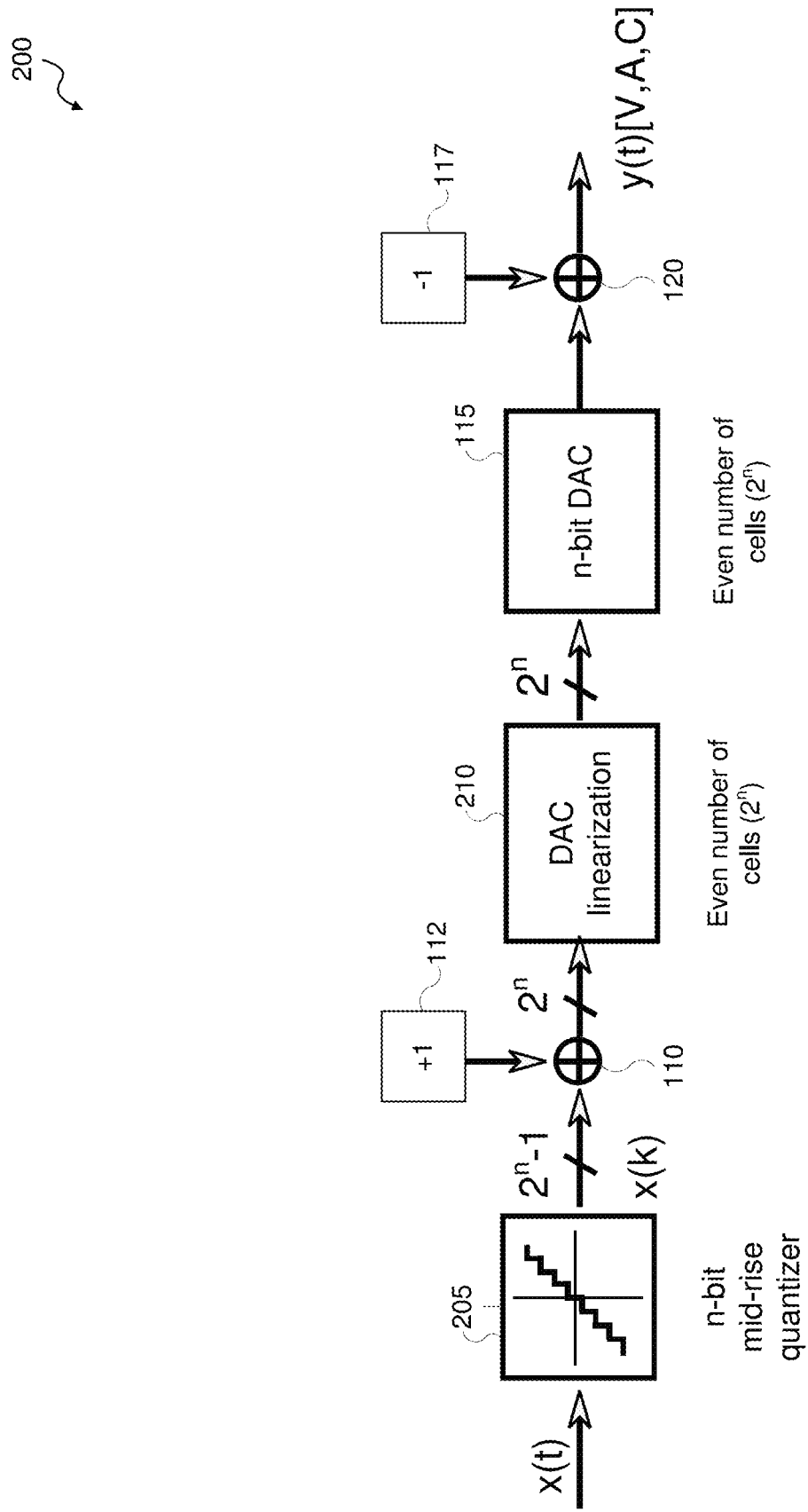
FIG. 2A illustrates a digital-to-analog conversion system according to an exemplary aspect of the present disclosure.

FIG. 2A illustrates a system 200 according to an exemplary aspect of the present disclosure. The system 200 is similar to the system 100, but includes an n-bit mid-rise quantizer 205 that generates the digital signal x(k) ultimately provided to the DAC 115. The system 200 can also include a DAC linearizer 210 that is configured to linearize the digital signal x(k) generated by the n-bit mid-rise quantizer 205.

In operation, the n-bit mid-rise quantizer 205 generates the digital signal x(k) from an analog signal x(t). In an exemplary aspect, the n-bit mid-rise quantizer 205 can include processor circuitry configured to convert an analog signal to a digital signal. In an exemplary aspect, the n-bit mid-rise quantizer 205 can include one or more comparators (e.g., n comparators) configured to generated the digital signal x(k). For example, each of the comparators can be configured with a reference threshold (e.g., reference voltage and/or current) which can be compared with the value of the analog signal x(t). The comparators can then generate an output signal based on the respective comparisons to generate the digital signal x(k).

Like system 100, the digital signal x(k) can include an odd number of signals (e.g., $2^n-1$ signals). In an exemplary operation, the $2^n-1$ signals can be adjusted by an offset value 112 (e.g., +1) while the analog output signal is adjusted by corresponding offset value 117 (e.g., −1) to compensate and account for the offset to the digital input signals. In this example, mixer 110 adds the offset value 112 (e.g., +1) to the input signals x(k) (e.g., $1+2^n-1=2^n$). In an exemplary aspect, the adjustment of the $2^n-1$ signals (e.g., the addition of the $2^n-1$ signals with the offset 112) produces a quantizer output (i.e., $2^n$ signals) that is similar to an output produced by a mid-tread quantizer. The compensation of the analog output signal of the DAC 115 using offset 117 compensates for the adjustment of the digital signal based on the offset 112 while also reduces or avoids an output y(t) that is zero or near zero (which can be used to advantageously reduce or avoid the occurrence of a "dead zone" state as described below). In this example, the offset 112 can generate a digital offset value (e.g., +1) and the offset 117 can generate an analog offset value (e.g. the analog equivalent to the digital offset value of offset 112) to compensate for the digital offset value provided by the offset 112. For example, a digital offset value of +1 can correspond to a voltage (e.g. 0.5 V) and/or a current (e.g. 1 mA). The offset 117 can be configured to generate an additive inverse offset value (e.g. −0.5 V, −1 mA) to compensate for the offset value provided by offset 112.

The output of the mixer 110 can then be provided to the DAC linearizer 210. The linearizer 210 can be configured to cancel or reduce distortion generated by, for example, multibit DAC mismatch. In an exemplary aspect, the linearizer 210 can be configured to perform, for example, bit shuffling to cancel or reduce distortion, but is not limited thereto. The linearizer 210 can include processor circuitry configured to perform one or more operations and/or functions of the linearizer 210. In an exemplary aspect, the linearizer 210 can include an even number of cells (e.g., $2^n$ cells). In an exemplary aspect, the linearizer 210 can be configured to perform one or more linearization operations (e.g. bit shuffling) on at least a subset of the input signals (e.g., from mixer 110), which is illustrated in more detail in FIG. 2B. Advantageously, linearizing only a subset of input signals can reduce circuit area and/or current consumption while also linearizing the subset of input signals which may be subject to higher levels of distortion.

The output of the linearizer 210 can then be provided to the DAC 115, and the analog output of the DAC 115 can be adjusted and compensated using mixer 120 and offset value 117 similar to the operation of system 100. In an exemplary aspect, the linearizer 210 be configured downstream of the DAC 115 to linearize (e.g., cancel or reduce distortion of) the analog output of the DAC 115. Additionally or alternatively, the linearizer 210 can be incorporated in the DAC 115 and be configured to perform one or more linearization operations during the digital-to-analog conversion by the DAC 115.

Figure 2B:
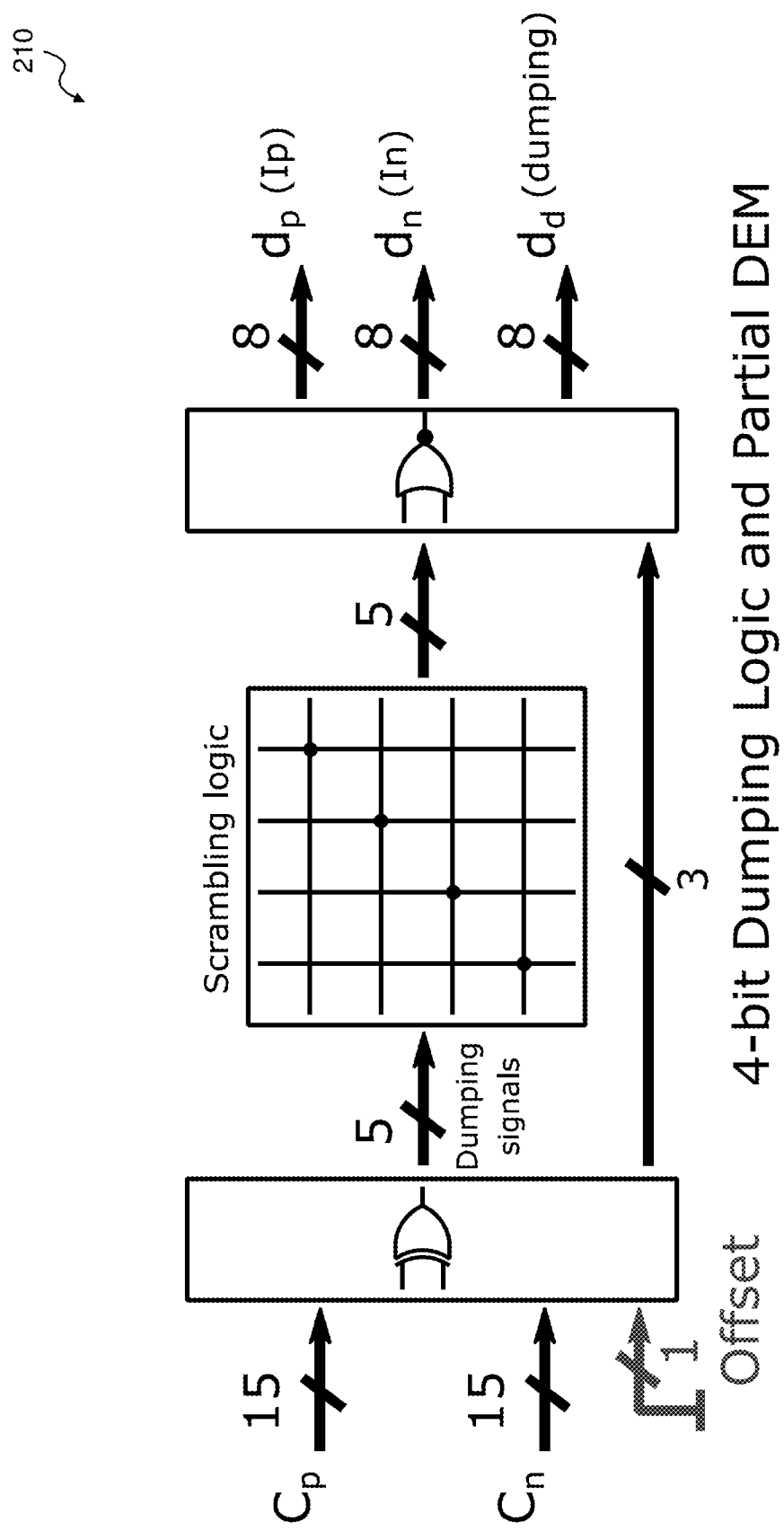
FIG. 2B illustrates a linearizer according to an exemplary aspect of the present disclosure.

FIG. 2B illustrates the linearizer 210 according to an exemplary aspect of the present disclosure. As shown, the linearizer 210 is configured to linearize a subset of the input signals. For example, 5 dumping signals are linearized and 3 of the signals are not linearized. In an exemplary aspect, the 5 dumping signals that are linearized correspond to paired cells 11-2, 10-3, 9-4, 8-5, and 7-6 as shown in FIG. 4B while the 3 non-linearized signals correspond to paired cells 14-tieo, 13-0, and 12-1. The present disclosure is not limited to this example configuration and any combination of linearized and non-linearized signals can be configured according to the exemplary aspects of the present disclosure.

Figure 3:
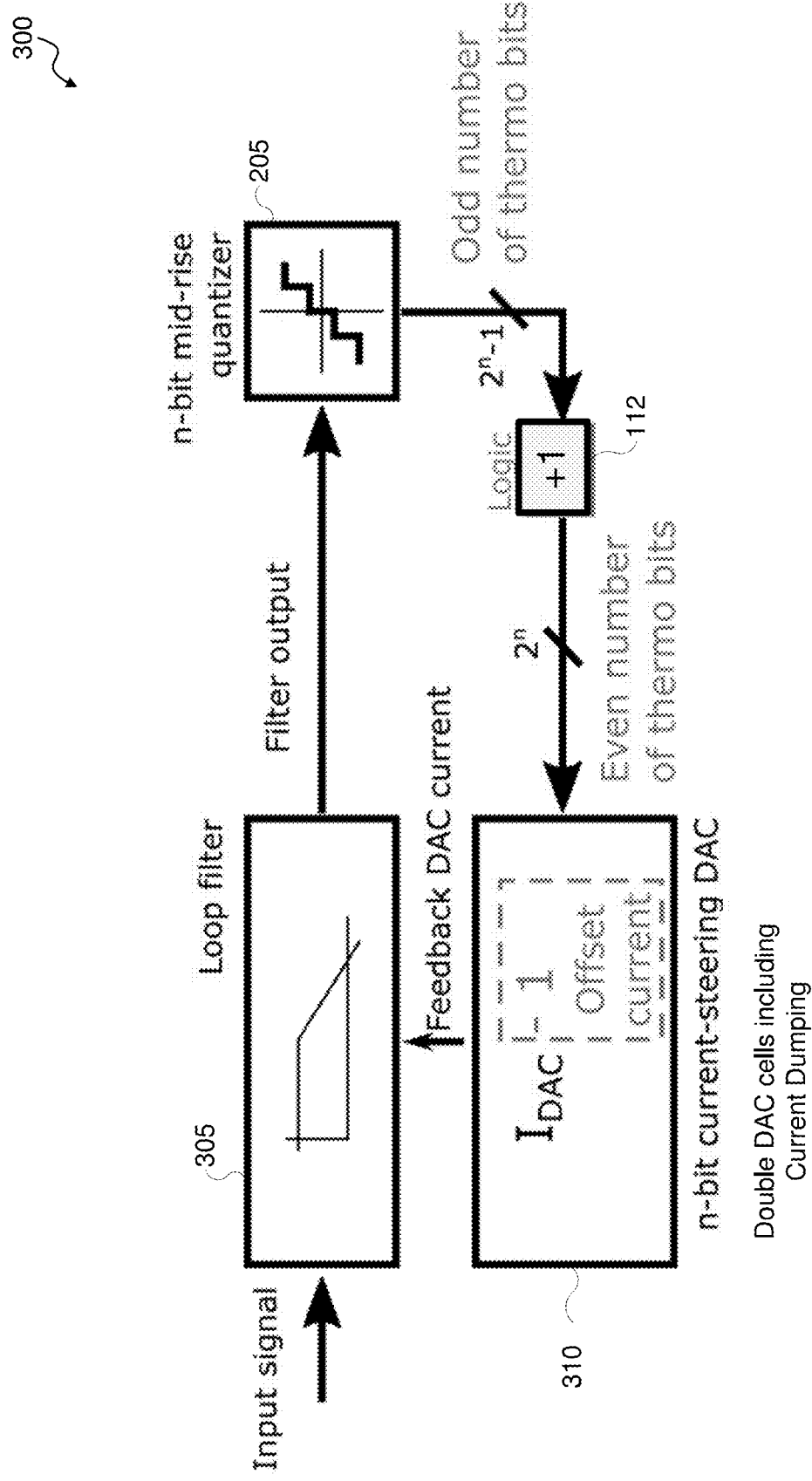
FIG. 3 illustrates a digital-to-analog conversion system including a feedback digital-to-analog converter according to an exemplary aspect of the present disclosure.

One or more of the exemplary aspect can be applied to, for example, a feedback DAC of a Delta-Sigma ADC. This is illustrated in FIG. 3. In an exemplary aspect, the feedback of the Delta-Sigma loop is modified to adjust the output of the mid-rise quantizer 205. For example, the analog output signal of filter 305 is provided to the mid-rise quantizer 205. The mid-rise quantizer 205 can convert the received analog signal to an odd number of output digital signals ($2^n-1$ signals). The odd number of digital output signals ($2^n-1$ signals) can be adjusted to generate an even number of digital signals ($2^n$ signals). For example, an offset value 112 can be added to the $2^n-1$ signals to generate the $2^n$ signals. The $2^n$ signals can then be provided to the input of the DAC 310. The output of the DAC 310 is then fed back to the filter 305. The filter 305 can be a loop filter, but is not limited thereto.

In an exemplary aspect, the DAC 310 is an n-bit current-steering DAC, but is not limited thereto. In this example, the DAC 310 can utilize double cells and/or current dumping. In this example, the DAC 310 is configured to compensate for the adjusted output of the mid-rise quantizer 205, as illustrated by the current offset value of "−1" within the DAC 310.

In an exemplary aspect, a fixed unity is added to an odd number of output bits, such as the odd output of an n-bit mid-rise quantizer. With this addition, the current dumping can be determined, and then removed in or after the DAC.

FIG. 4A illustrates an input/output matrix of a 4-bit DAC, such as a 4-bit current steering DAC. In an example operation, based on the quantizer output code, only a fraction of the current cells contribute to the output differential current. For example, for a quantizer code equal to "2," the current provided by cells "0" and "1" is cancelled by the current provided by cells "14" and "13." In this example, although cells 0, 1, 13, and 14 do not contribute to the output differential signal, they may increase the output noise. In an exemplary aspect, current dumping can be used to reduce unused cells and steer their current to a dumping node. As a result, the noise of the DAC can be reduced, especially for middle codes (i.e. for small signals).

Figure 5:
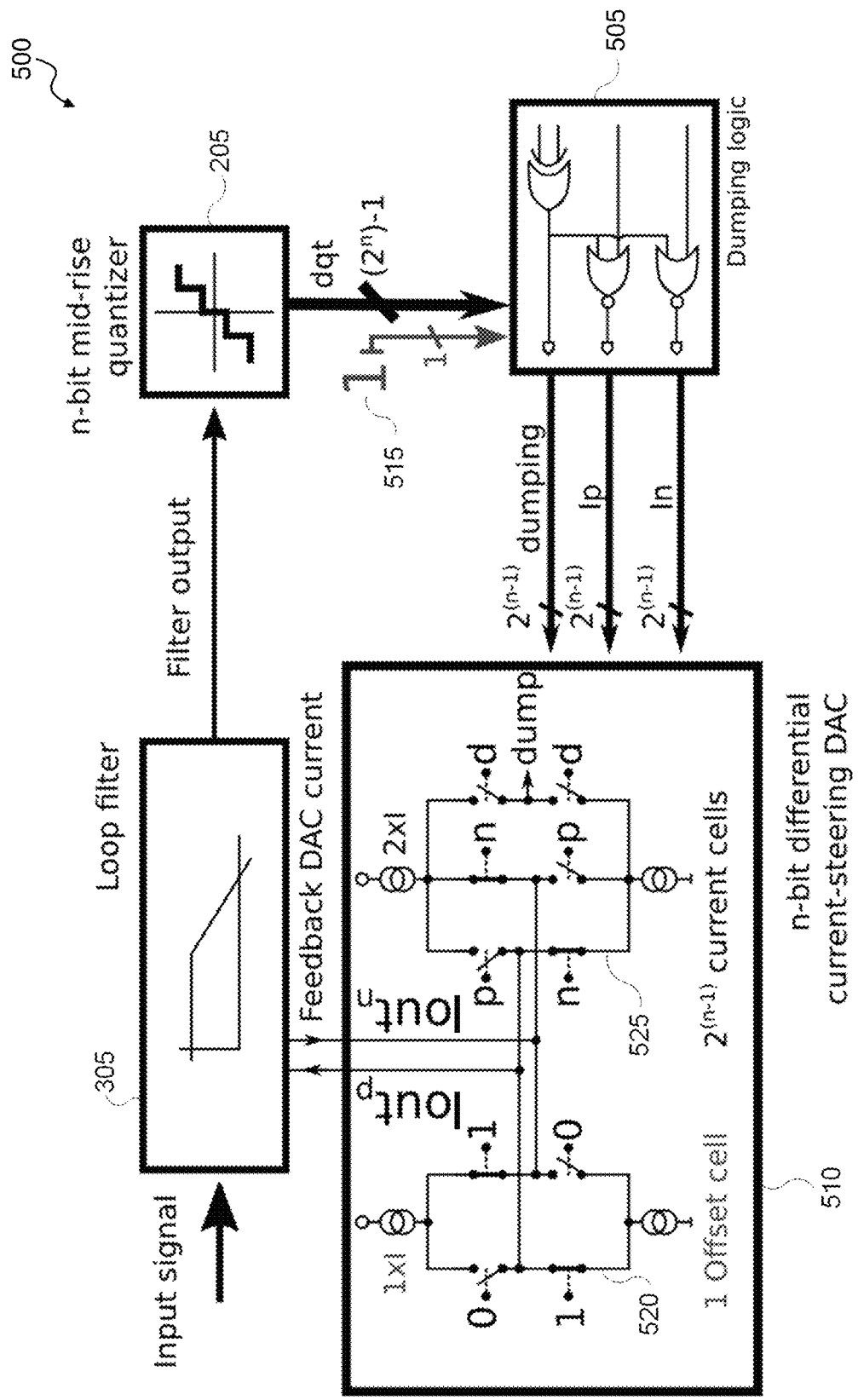
FIG. 5 illustrates a digital-to-analog conversion system including a feedback digital-to-analog converter according to an exemplary aspect of the present disclosure.

FIG. 4B illustrates an input/output matrix of a 4-bit DAC (e.g. a 4-bit current steering DAC) having an input of the DAC compensated and adjusted, such as illustrated in the exemplary aspects of the present disclosure shown in, for example, FIG. 5. For example, an input can be added to the odd-numbered inputs (e.g., 15 inputs) to the DAC so that the DAC has 16 inputs. This additional input ("tieo") is tied to a fixed value (e.g., tied to a value of 1). By adding the additional input, the even numbered cells can be paired (e.g., 14-tieo, 13-0, 12-1, 11-2, 10-3, 9-4, 8-5, 7-6), resulting with an even number of cells (e.g., 8). In this example, as shown in FIG. 4B, the cells are double so that the cells output either +2 or −2 units of current. That is, the DAC can include 8 cells having a doubled current unit output. In comparison, the DAC configuration illustrated in FIG. 4A includes 15 cells having a single current unit output. By pairing the cells, the number of cells can be reduced (e.g. 15 to 8) while maintaining the output value range of the DAC due to the doubling of the current values.

The third state is represented by the number 0, which corresponds to the dumping state and where the corresponding cell is detached from the output of the DAC, and thereby does not contribute to noise at the output of the DAC. By comparing FIGS. 4A and 4B, the exemplary aspects illustrated in FIG. 4B have increased simplification of circuit design and circuit layout, as well as increased matching between DAC cells.

FIG. 5 illustrates a feedback DAC of a Delta-Sigma ADC system 500 according to an exemplary aspect. The system 500 is similar to the system 300 of FIG. 3. The system 500 is described with reference to the input/output matrix of FIG. 4B.

In an exemplary aspect, the feedback of the loop (e.g. Delta-Sigma loop) is modified to adjust the output of the mid-rise quantizer 205. An output 515 is added as an output of the mid-rise quantizer 205. In this example, the output 515 has a fixed value of 1, but is not limited thereto. The offset value at the output 515 can be any offset value that will compensate and cancel the impact of the offset cell 520 on the DAC 510. The now even number of outputs are supplied to the dumping logic 505. The dumping logic 505 is configured to generate a combination of one or more dumping output signals, one or more positive output signals (Ip), and/or one or more negative output signals (In). The generation can be based on the signals received from the mid-rise quantizer 205. The relationship of the logic output signals to the input signals (i.e., signals from the quantizer 205) is illustrated in the input/output matrix of FIG. 4B. For example, with reference to FIG. 4B, if the output of the mid-rise quantizer 205 corresponds to QT code 4, the dumping logic 505 can output a sequence that includes: five dumping signals ("0"), three negative (In) signals ("−2") and zero positive (Ip) signals (e.g., 0, 0, 0, 0, 0, −2, −2, −2). Based on this sequence and the compensation of the additional input in the DAC 510 by the offset cell 520, the differential current (Idiff) of the DAC has a value of −14. The positive current output ($Iout_p$) and the negative current output ($Iout_n$) of the DAC 510 are collectively represented by the differential current (Idiff) output.

In an exemplary aspect, if the mid-rise quantizer 205 is replaced with a mid-tread quantizer (see FIG. 6) in the Delta-sigma loop configuration (e.g. where quantizer is kept in single bit toggling even for small signal levels), the system may exhibit a "dead zone" state (e.g., when the feedback behavior is based only on parasitics) in the feedback. However, by including the compensation and adjustment of odd inputs to the DAC 510, the system 500 can reduce or avoid the mid-tread quantizer exhibiting a zero or low output due to a small input signal. That is, even if the input to the DAC 510 is zero or low, the DAC 510 will at least output the offset value (e.g. −1) due to the compensation operations of the DAC 510. Advantageously, the "dead zone" state in the feedback can be reduced or avoided. That is, by compensating in the DAC 510, the feedback current provided to the filter 305 from the DAC 510 will include the offset current value. In aspects that include the mid-rise quantizer 205, the system can also advantageously avoid or reduce the dead zone state due to a quantizer threshold at a zero input.

As shown in FIG. 5, in an exemplary aspect, the dumping logic 505 includes an XOR logic gate, and two NOR logic gates, but is not limited thereto. The dumping logic 505 can include additional or alternative logic gates as would be understood by one of ordinary skill in the relevant arts.

In an exemplary aspect, the XOR gate is configured to receive the paired signals (e.g., 14-tieo, 13-0, 12-1, 11-2, 10-3, 9-4, 8-5, 7-6) and output the dumping signal. Each of the NOR gates are configured to receive the output of the XOR gate as a first input and the paired signals that are not in a dumping state (see FIG. 4B). The output of a first of the NOR gates corresponding to the positive (Ip) signal and the output of the second of the NOR gates corresponding to the negative (In) signal. In an exemplary operation, the sign of the middle comparator determines which the NOR gates is selected to control the DAC 510. If the middle comparator is positive, the positive (Ip) signal controls while the negative (In) signal controls if the middle comparator is negative.

In an exemplary aspect, the DAC 510 includes an offset cell 520 that is tied to a fixed value (or adjustable value) and $2(n^{-1})$ current cells 525 that are controlled based on the dumping, positive, and negative output signals of the dumping logic 505. In operation, the offset cell 520 compensates for the additional output 515 added to the mid-rise quantizer 205 as an additional input to the DAC 510 via the dumping logic 505. The offset cell 520 outputs an offset current (e.g. a fixed offset current) that is output from the DAC 510. In this example, the current of the offset cell 520 is not signal dependent and, for each quantizer code, simply gives the offset value (e.g. a −1 unit DAC current as shown in FIG. 4B, Ioffs column (light blue)). This offset value compensates and restores the expected feedback signal for the (Delta-Sigma) control loop without adding extra signal-dependent non-linearity.

With continued reference to FIG. 5 and FIG. 4B, in an exemplary aspect, the DAC 510 includes eight current cells 525 and an offset cell 520 connected to each of the current cells 525. In an example operation where the current QT code is 6, seven of the current cells 525 are in the dumping state ("0") and one of the current cells 525 (e.g., the cell shown in FIG. 5) operates in the negative output current (In) state ("−2"). In this operation, the positive current terminal of the current cell 525, which produces a +2 current unit, and the positive current terminal of the offset cell 520, which produces a +1 current unit, are connected to the negative current output ($Iout_n$) of the DAC 510. Here, the negative current output ($Iout_n$) functions as a current sink (represented by the arrow direction into the DAC 510) and the current unit value at the negative current output ($Iout_n$) is 3 current units (e.g., +2 from the current cell is summed with the +1 from the offset cell 520). Similarly, the negative current terminal of the current cell 525, which produces a −2 current unit, and the negative current terminal of the offset cell 520, which produces a −1 current unit, are connected to the positive current output ($Iout_p$) of the DAC 510 Here, the positive current output ($Iout_p$) functions as a current source (represented by the arrow direction out of the DAC 510) and the current unit value at the current output ($Iout_p$) is also −3 current units (e.g., −2 from the current cell is summed with the −1 from the offset cell 520). The positive current output ($Iout_p$) (e.g., −3 current value) and the negative current output ($Iout_n$) (e.g., 3 current value) result in the DAC 510 having a differential output (Idiff) of −6 current units (i.e., (−3)−3=−6), which is also reflected in the Idiff value for QT code 6 in FIG. 4B.

In an exemplary aspect, the system 500 includes a linearizer that is configured to perform one or more linearization operations. For example, the system 500 can include a linearizer similar to the linearizer 210 described with reference to FIGS. 2A and 2B. The linearizer can be configured between the quantizer 205 and the dumping logic 505, between the dumping logic 505 and the DAC 510, and/or within the DAC 510 itself.

Figure 6:
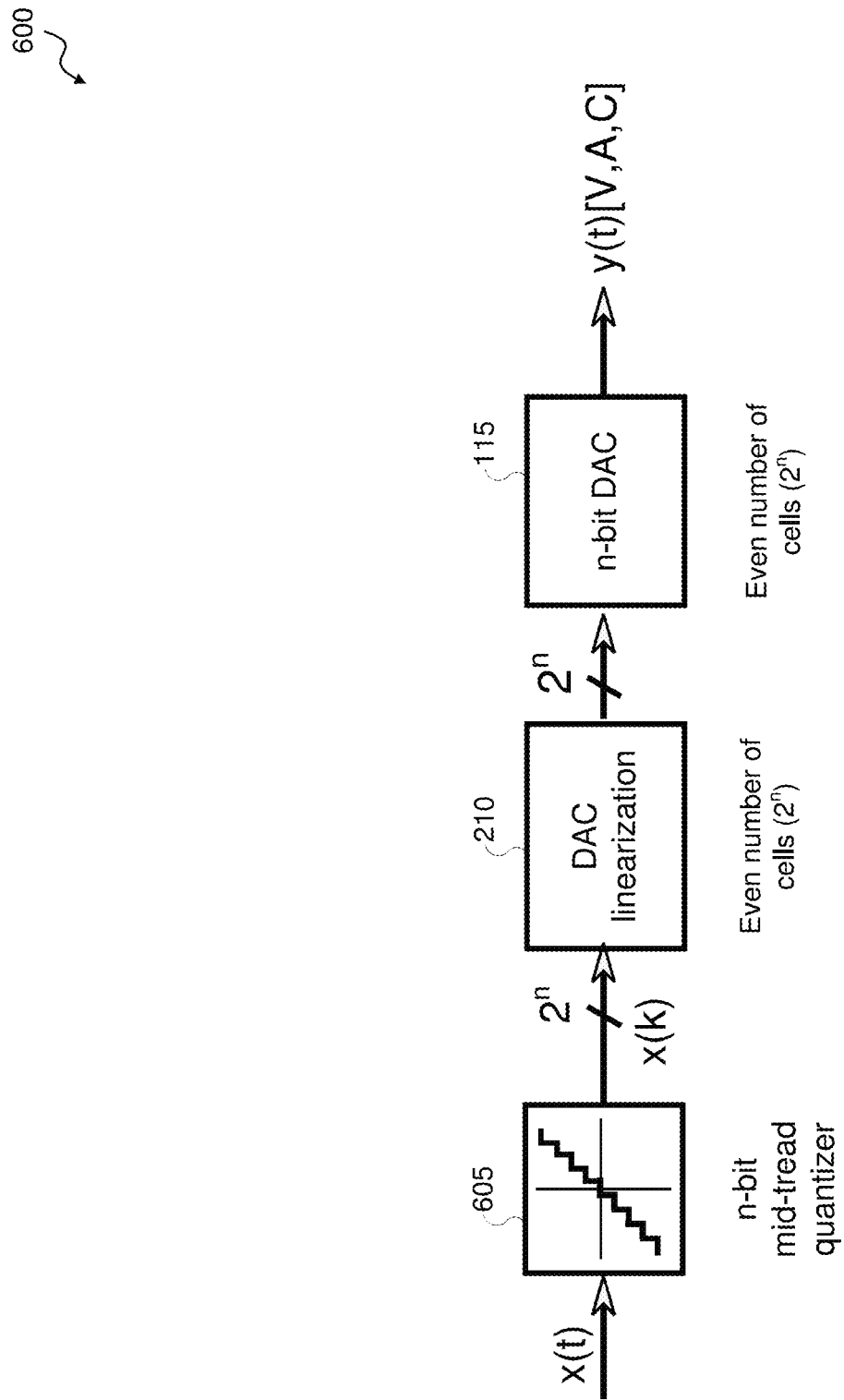
FIG. 6 illustrates a digital-to-analog conversion system according to an exemplary aspect of the present disclosure.

FIG. 6 illustrates a system 600 according to an exemplary aspect of the present disclosure. The system 600 includes an n-bit mid-tread quantizer 605, a DAC linearizer 210 and DAC 115.

In operation, the n-bit mid-tread quantizer 605 generates an even number of digital signals x(k). This is different from the n-bit mid-rise quantizer 205 of system 200 which outputs an odd number of output signals. By using an n-bit mid-tread quantizer 605, the system 600 is compensated such that the DAC 115 can be configured with an even number of cells. In comparison to the n-bit mid-rise quantizer 205 of system 200 in which the inputs and outputs of the DAC 115 are compensation, the system 200 can be configured to advantageously reduce or eliminate zero or near zero outputs of the DAC 115, thereby reducing or avoiding the occurrence of a "dead zone" state.

FIGS. 7A-7E illustrate DAC compensation systems having a DAC 715 according to exemplary aspects of the present disclosure.

The DAC compensation system can include a DAC 715 having a converter 750 that is configured to convert one or more digital input signals to one or more corresponding analog signals. The DAC 715 can include one or more input ports (also referred to as inputs) 701 configured to receive one or more input signals and provide the received signals to the converter 750. The DAC 715 can also include one or more output ports (also referred to as output ports) 702 that are configured to receive corresponding converted signals and to provide the converted signals to one or more other (e.g. external) devices. In an exemplary aspect, the DAC 715 is similar to the DACs 115, 310, and/or 510.

In an exemplary aspect, the converter 750 can include one or more signal generators 725 that are configured to generate one or more analog signals based on one or more received digital signals. The signal generators 725 can include one or more circuits and/or logic that is configured to generate one or more analog signals based on one or more corresponding digital signals. In an exemplary aspect, the signal generator (s) can include processor circuitry configured to perform this function. As illustrated in FIGS. 7A-7E, the signal generators 725 are each associated with a corresponding input 701 and output 702 (e.g. in a 1:1:1 relationship). However, one or more of the signal generators 725 can be associated with two or more inputs 701 and/or outputs 702.

In an exemplary aspect, the DAC compensation system can further include an offset generator 712 and an offset compensator 717. In exemplary aspects, the offset generator 712 and/or the offset compensator 717 can be implemented within the DAC 715, or the offset generator 712 and/or the offset compensator 717 can be separate components of the DAC compensation system. For example, the offset generator 712 can be separate from the DAC 715 while the offset compensator 717 is implemented within the DAC 715 (FIG. 7A); both the offset generator 712 and the offset compensator 717 can be separate components (FIG. 7B); both the offset generator 712 and the offset compensator 717 can be implemented within the DAC 715 (FIG. 7C); or the offset generator 712 can be implemented within the DAC 715 while the offset compensator 717 is separate from the DAC 715.

In an exemplary aspect, the offset generator 712 is configured to generate an offset value and provide the offset value to the converter 750 of the DAC 715. The offset value can represent an additional input to the DAC 715 so as to adjust the input signals of the converter 750. In an exemplary aspect, the offset generator 712 is an embodiment of the offset 112 and/or 515.

In an exemplary aspect, the DAC 715 includes an odd number (e.g., $2^n-1$ signals) of inputs 701. The offset generator 712 can be configured to generate and provide an offset value to the convertor 750 to adjust the number of inputs of the DAC 715 such that the input signals received by the converter 750 become an even number of signals (e.g., Ti signals). The offset value from the offset generator 712 can be a fixed value or can be dynamically adjusted similar to the offset 112 of FIG. 1. In an exemplary aspect, the offset generator 712 includes processor circuitry that is configured to perform one or more functions and/or operations of the offset generator 712, including generating and providing an offset value. In an exemplary aspect, the offset generator 712 can include one or more voltage and/or current sources that are configured to generate a voltage/current value as the offset value.

The offset compensator 717 can be configured to generate and provide an offset value to the output of one or more of the signal generators 725 (or to the outputs 702) to compensate for the offset value introduced by the offset generator 712. That is, after the digital-to-analog conversion by the converter 750, the analog offset value (from offset compensator 717) corresponding to the digital offset value generated by offset generator 712 is subtracted from the output(s) of the signal generator(s) 725 to compensate for the pre-conversion adjustment by the offset generator 712 to restore the output of the DAC 715 to the intended output signal. In this example, the offset compensator 717 is configured to output an analog output value that corresponds to the digital offset value output by the offset generator 712. The offset value from the offset compensator 717 can be a fixed value or can be dynamically adjusted similar to the offset 117 of FIG. 1. In an exemplary aspect, the offset compensator 717 can include one or more voltage and/or current sources that are configured to generate a voltage/current value as the offset value. In an exemplary aspect, the offset compensator 717 is an embodiment of the offset 117 and/or 520.

Figure 7A:
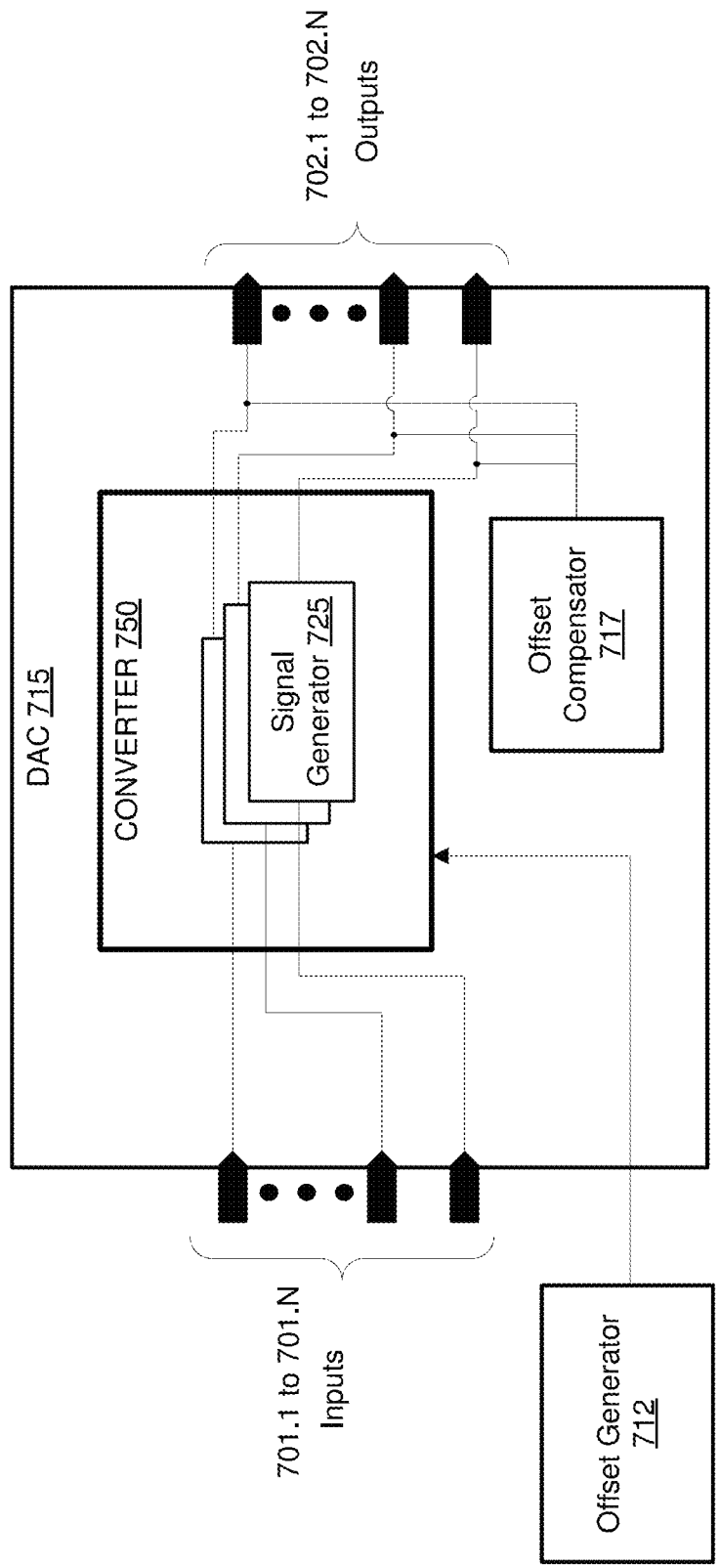
FIGS. 7A-7E illustrate digital-to-analog conversion systems according to exemplary aspects of the present disclosure.
Figure 7B:
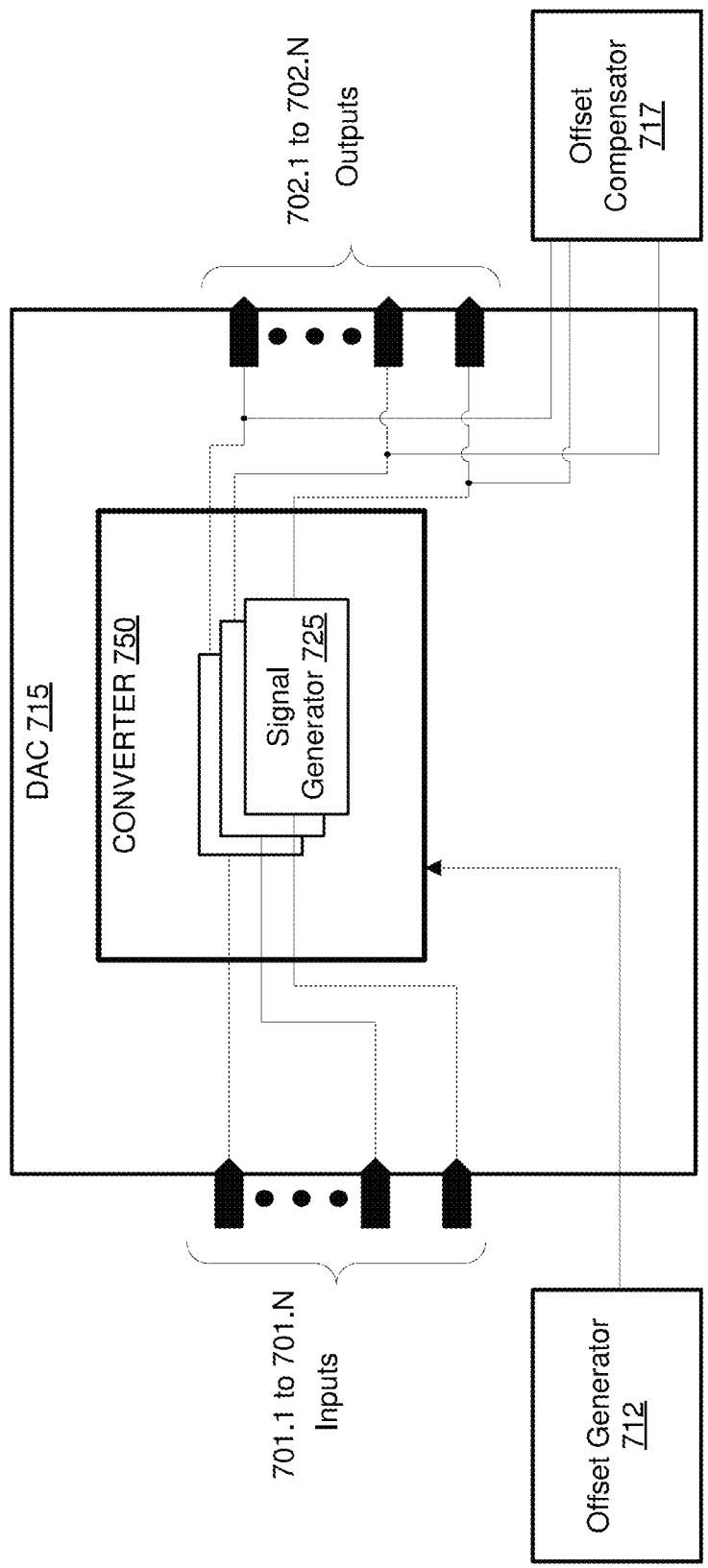
Figure 7C:
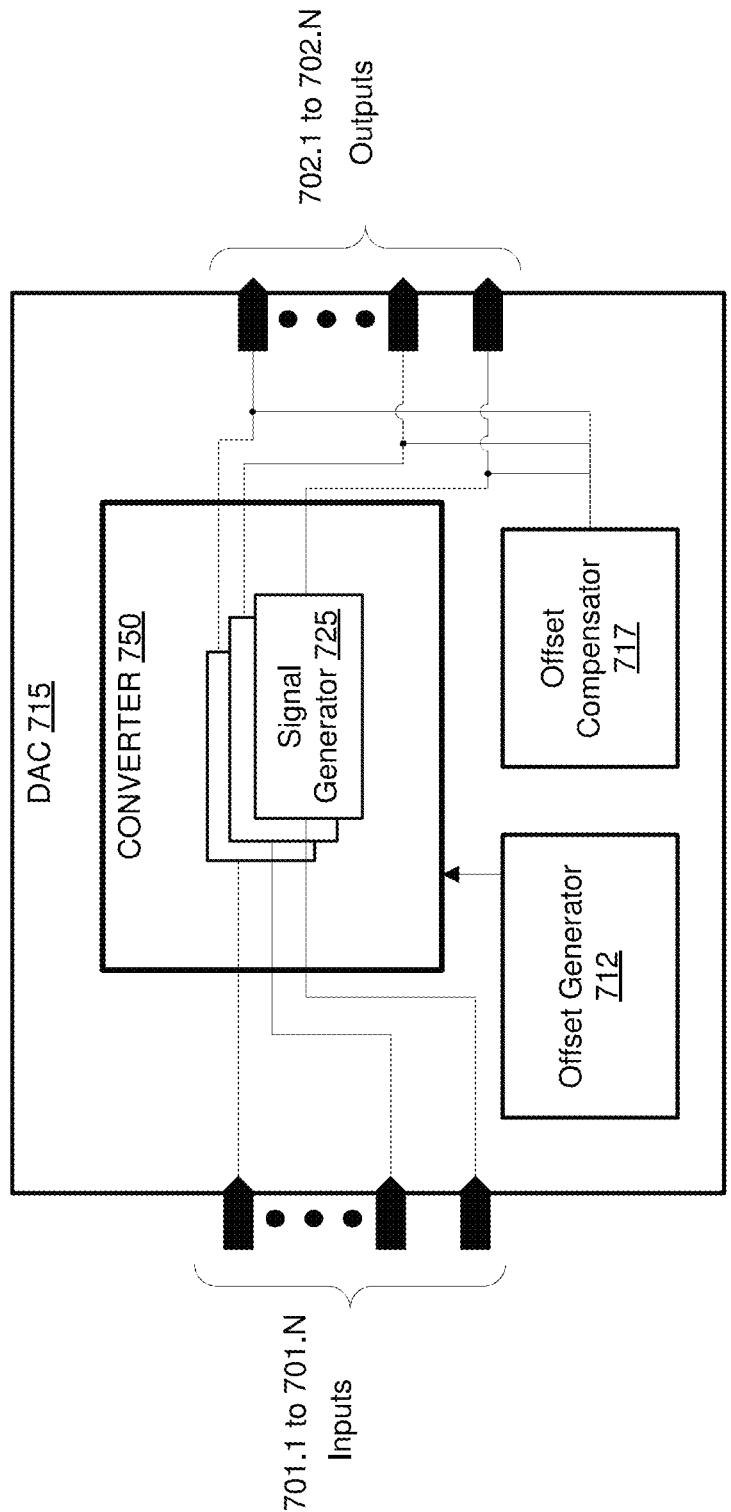
Figure 7D:
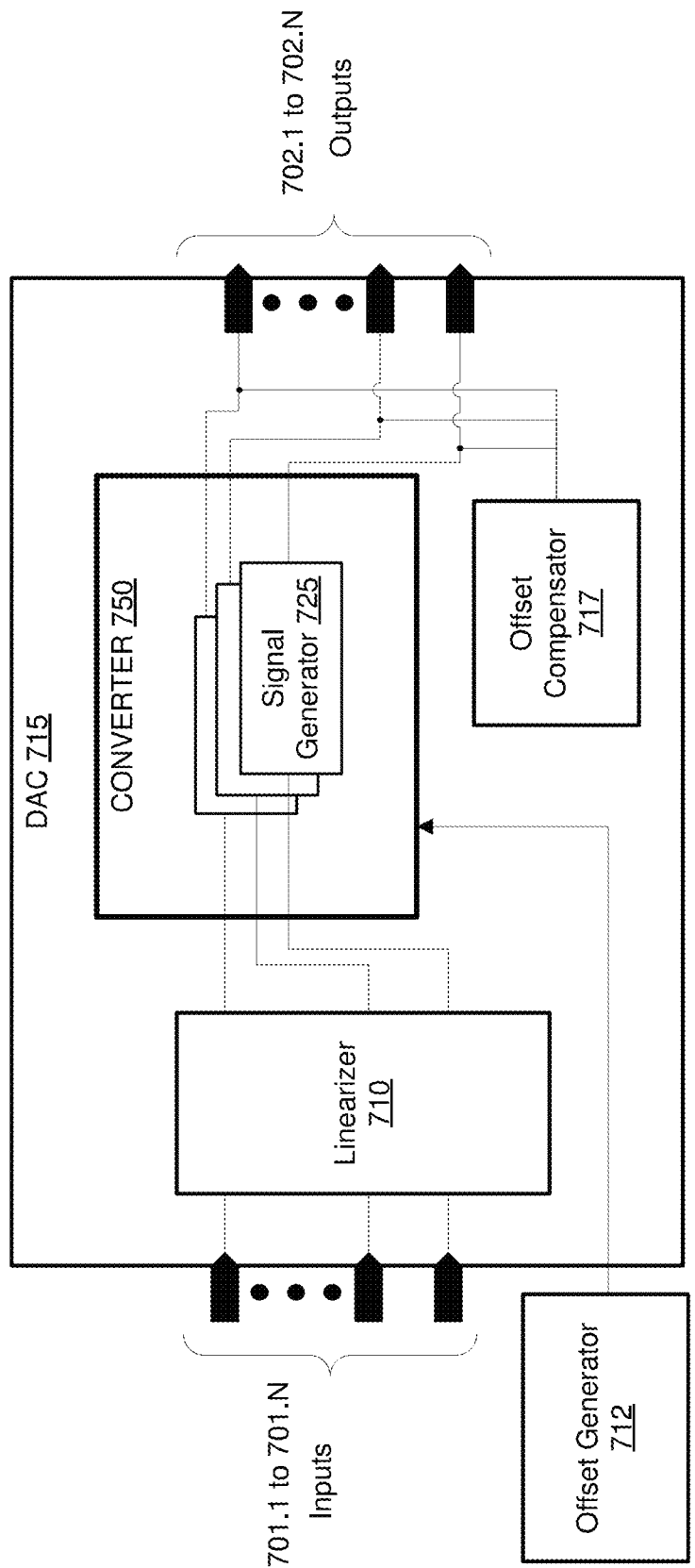
Figure 7E:
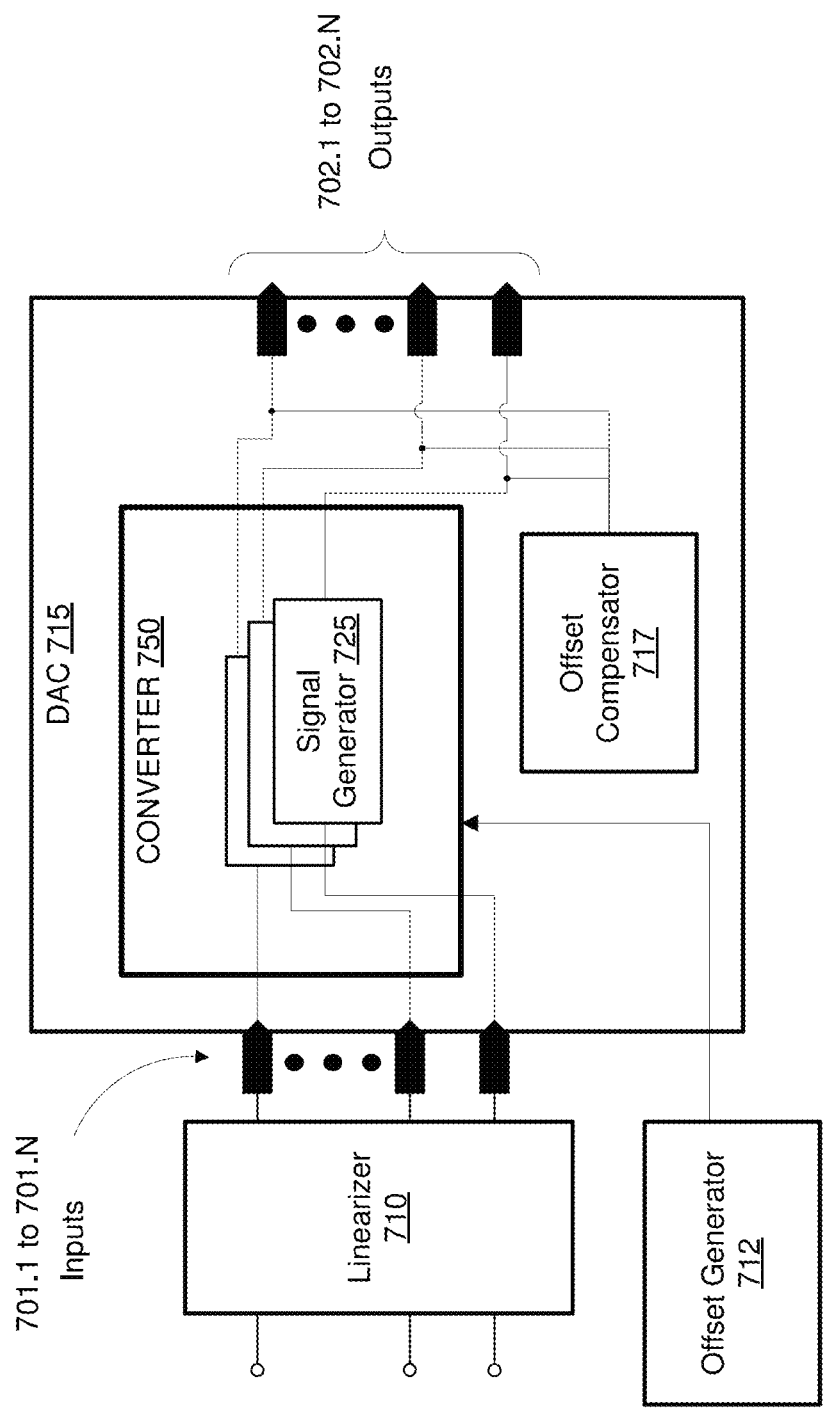

In an exemplary aspect, the DAC compensation system further includes a linearizer 710 as shown in FIGS. 7D-7E. Although not illustrated in FIGS. 7A-7C, it should be understood that the linearizer 710 can be implemented in the DAC compensation systems illustrated thereon similar to aspects illustrated in FIGS. 7D-7E. The linearizer 710 can be an aspect of the linearizer 210 discussed above.

In an exemplary aspect, the linearizer 710 can be configured to cancel or reduce distortion generated by, for example, multi-bit DAC mismatch. In an exemplary aspect, the linearizer 710 can be configured to perform, for example, bit shuffling to cancel or reduce distortion, but is not limited thereto. The linearizer 710 can include processor circuitry configured to perform one or more operations and/or functions of the linearizer 710. In an exemplary aspect, the linearizer 710 can be configured to perform one or more linearization operations (e.g. bit shuffling) on at least a subset of the input signals from inputs 701 similar to the configuration illustrated in FIG. 2B. Advantageously, linearizing only a subset of input signals can reduce circuit area and/or current consumption while also linearizing the subset of input signals which may be subject to higher levels of distortion.

As shown in FIG. 7D, the linearizer 710 can be implemented in the DAC 715. In this example, the linearizer 710 can be configured to receive input signals from the inputs 701 and to generate one or more corresponding linearized signals based on the received input signals. In aspects where the linearizer 710 only linearizes a subset of the received input signals, one or more of the received signals can be passed through the linearizer 710 to the converter 750 without being subjected to linearization operation(s) (i.e. without being linearized). Alternatively, the linearizer 710 can be separate from the DAC 715 within the DAC compensation system as illustrated in FIG. 7E.

Figure 8:
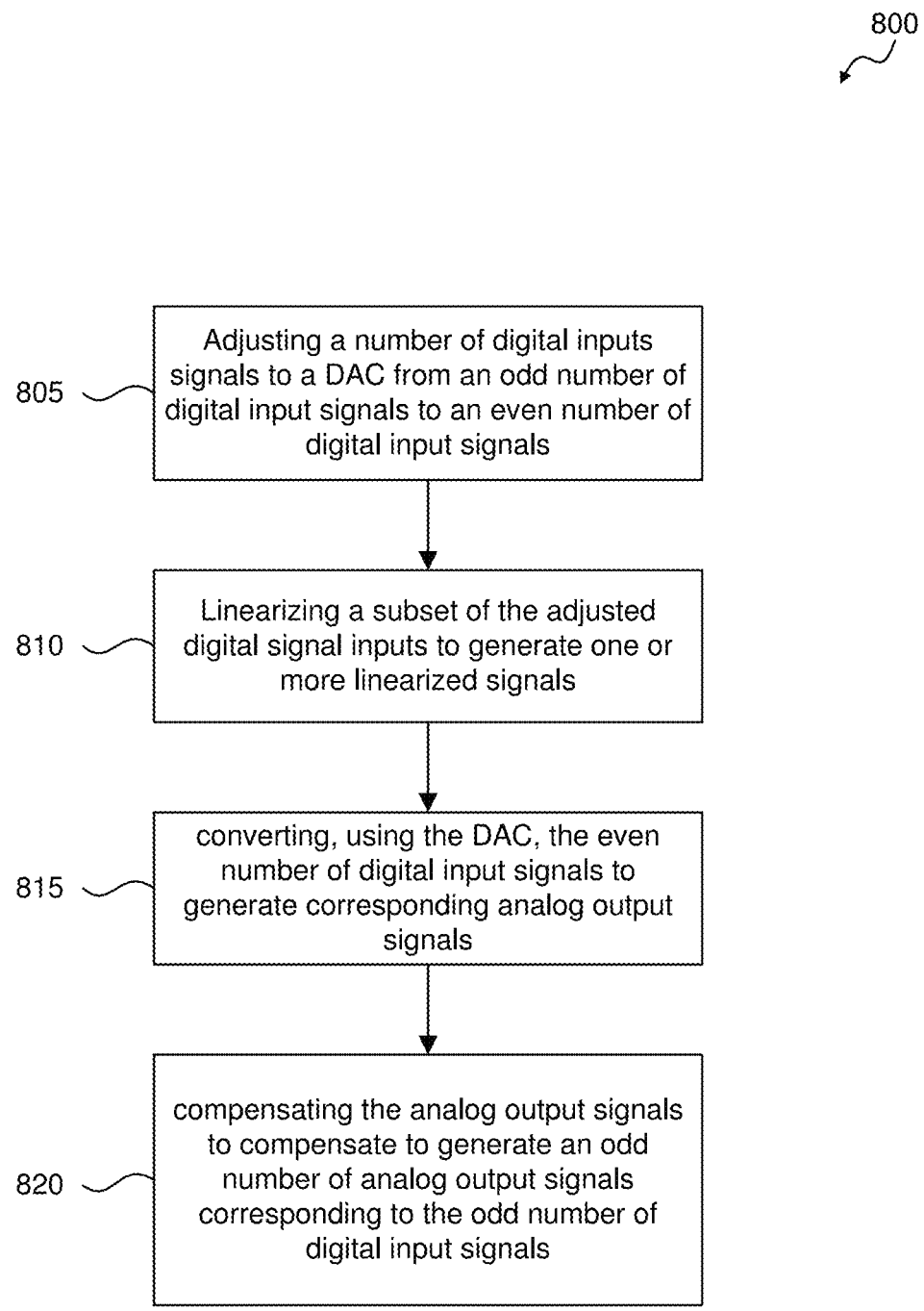
FIG. 8 illustrates a digital-to-analog conversion compensation method according to an exemplary embodiment of the present disclosure.

FIG. 8 illustrates a flowchart of a DAC compensation method 800 according to an exemplary aspect of the present disclosure. The flowchart is described with continued reference to FIGS. 1-7E. The operations of the method are not limited to the order described below, and the various operations may be performed in a different order. Further, two or more operations of the method may be performed simultaneously with each other.

The flowchart 800 begins at operation 805, where a number of digital inputs signals to a DAC are adjusted from an odd number of digital input signals to an even number of digital input signals.

After operation 805, the flowchart transitions to operation 810, where a subset of the adjusted digital signal inputs are linearized to generate one or more linearized signals.

After operation 810, the flowchart transitions to operation 815, where the even number of digital input signals are converted (by the DAC) to generate corresponding analog output signals.

After operation 815, the flowchart transitions to operation 820, where the analog output signals are compensated to generate an odd number of analog output signals corresponding to the odd number of digital input signals.

Figure 9:
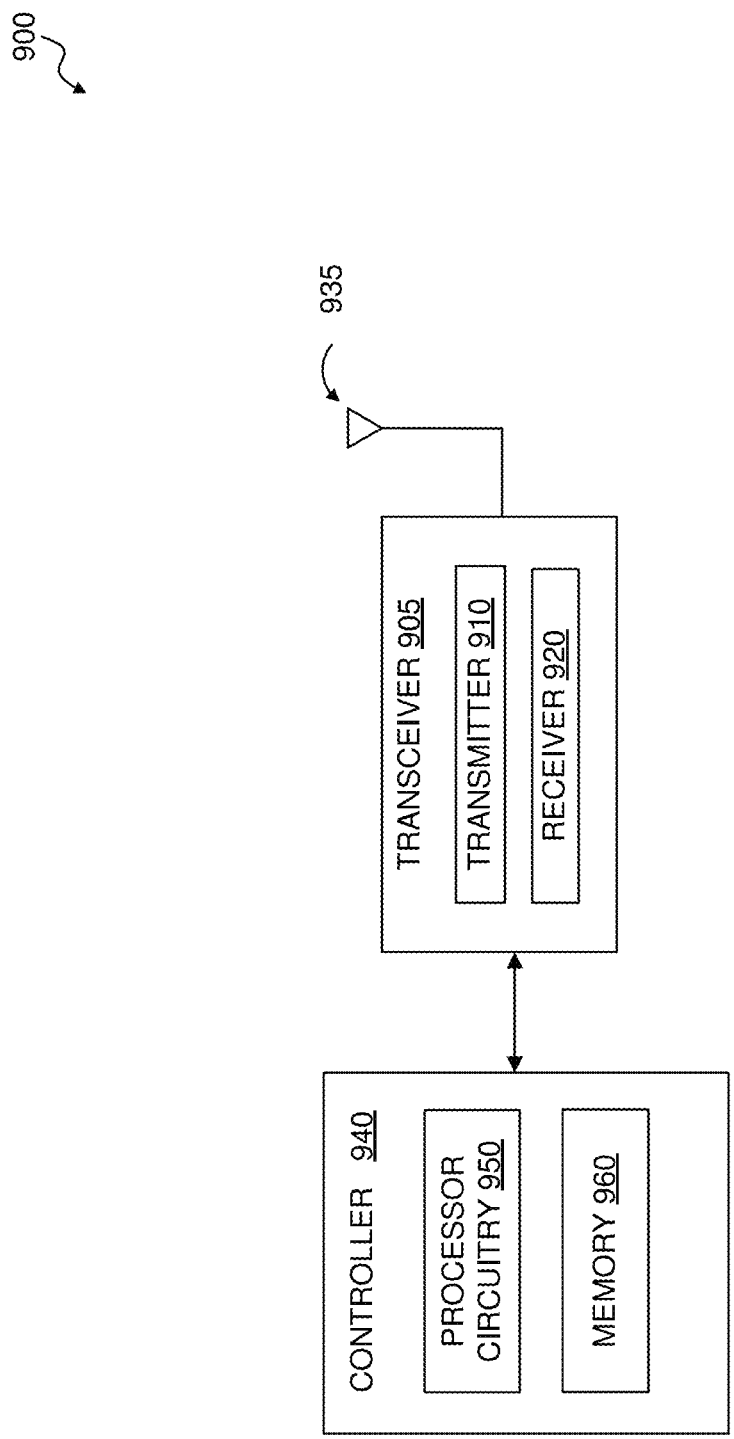
FIG. 9 illustrates a communication device according to an exemplary aspect of the present disclosure.

FIG. 9 illustrates a communication device 900. The communication device 900 can include controller 940 communicatively coupled to one or more transceivers 905 configured to transmit and/or receive wireless communications via one or more wireless technologies within the communication environment 100. The communication device 900 can be configured to perform DAC compensation based on one or more exemplary aspects discussed with reference to FIGS. 1-6 and/or one or more exemplary aspects described and illustrated in the attached Appendix.

The transceiver(s) 905 can each include processor circuitry that is configured for transmitting and/or receiving wireless communications conforming to one or more wireless protocols.

The transceiver 905 can include a transmitter 910 and receiver 920 that are configured for transmitting and receiving wireless communications, respectively, via one or more antennas 935.

In exemplary aspects, the transceiver(s) 905 can each include (but are not limited to) a digital signal processor (DSP), modulator and/or demodulator, a digital-to-analog converter (DAC) and/or an analog-to-digital converter (ADC), and/or a frequency converter (including mixers, local oscillators, and filters) that can be utilized in transmitting and/or receiving of wireless communications. Further, those skilled in the relevant art(s) will recognize that antenna 935 may include an integer array of antennas, and that the antennas may be capable of both transmitting and receiving wireless communication signals. In an exemplary aspect, the DAC included in the transceiver 905 can be configured to perform DAC compensation based on one or more exemplary aspects discussed above with reference to FIGS. 1-8.

The controller 940 can include processor circuitry 950 that is configured to control the overall operation of the communication device 900, such as the operation of the transceiver 905—including, for example, transmitting and/or receiving of wireless communications via the transceivers 905, perform one or more baseband processing functions (e.g., media access control (MAC), encoding/decoding, modulation/demodulation, data symbol mapping, error correction, etc.); perform one or more interference estimations; the running of one or more applications and/or operating systems; power management (e.g., battery control and monitoring); display settings; volume control; and/or user interactions via one or more user interfaces (e.g., keyboard, touchscreen display, microphone, speaker, etc.).

The controller 940 can further include a memory 960 that stores data and/or instructions, where when the instructions are executed by the processor circuitry 950, controls the processor circuitry 950 to perform the functions described herein. In an exemplary aspect, the memory 960 can store interference measurement information obtained from one or more interference measurement operations. The memory 960 can be any well-known volatile and/or non-volatile memory, and can be non-removable, removable, or a combination of both.

Examples of the communication device 900 can include (but are not limited to) a mobile computing device—such as a laptop computer, a tablet computer, a mobile telephone or smartphone, a "phablet," a personal digital assistant (PDA), and mobile media player; an internet of things (IOT) device, and a wearable computing device—such as a computerized wrist watch or "smart" watch, and computerized eyeglasses. In one or more aspects of the present disclosure, the communication device 900 may be a stationary device, including, for example, a base station, access point, a stationary computing device—such as a personal computer (PC), a desktop computer, a computerized kiosk, and an automotive/aeronautical/maritime in-dash computer terminal, and/or a smart device/appliance—such as, for example, smart lighting device, smart door lock, smart home security system, smart refrigerator, etc.

Example Computer System

Figure 10:
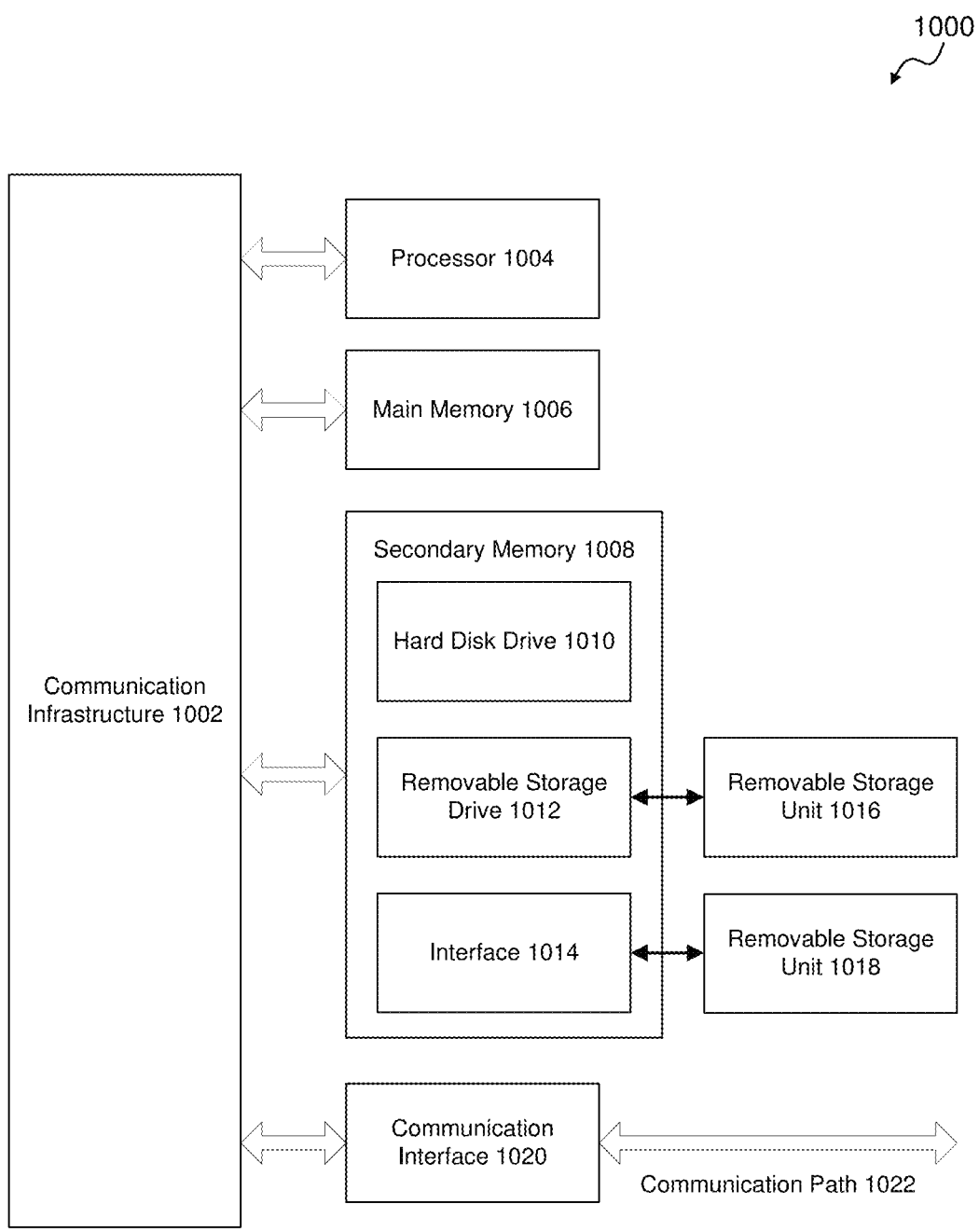
FIG. 10 illustrates a computer system according to an exemplary aspect of the present disclosure.

Various exemplary aspects described herein can be implemented, for example, using one or more well-known computer systems, such as computer system 1000 shown in FIG. 10. Computer system 1000 can be any well-known computer capable of performing the functions described herein.

Computer system 1000 includes one or more processors (also called central processing units, or CPUs), such as a processor 1004. Processor 1004 is connected to a communication infrastructure or bus 1006.

One or more processors 1004 may each be a graphics processing unit (GPU). In an aspect, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1000 also includes user input/output device(s) 1003, such as monitors, keyboards, pointing devices, etc., which communicate with communication infrastructure 1006 through user input/output interface(s) 1002.

Computer system 1000 also includes a main or primary memory 1008, such as random access memory (RAM). Main memory 1008 may include one or more levels of cache. Main memory 1008 has stored therein control logic (i.e., computer software) and/or data.

Computer system 1000 may also include one or more secondary storage devices or memory 1010. Secondary memory 1010 may include, for example, a hard disk drive 1012 and/or a removable storage device or drive 1014. Removable storage drive 1014 may be a floppy disk drive, a magnetic tape drive, a compact disk drive, an optical storage device, tape backup device, and/or any other storage device/drive.

Removable storage drive 1014 may interact with a removable storage unit 1018. Removable storage unit 1018 includes a computer usable or readable storage device having stored thereon computer software (control logic) and/or data. Removable storage unit 1018 may be a floppy disk, magnetic tape, compact disk, DVD, optical storage disk, and/any other computer data storage device. Removable storage drive 1014 reads from and/or writes to removable storage unit 1018 in a well-known manner.

According to an exemplary aspect, secondary memory 1010 may include other means, instrumentalities or other approaches for allowing computer programs and/or other instructions and/or data to be accessed by computer system 1000. Such means, instrumentalities or other approaches may include, for example, a removable storage unit 1022 and an interface 1020. Examples of the removable storage unit 1022 and the interface 1020 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1000 may further include a communication or network interface 1024. Communication interface 1024 enables computer system 1000 to communicate and interact with any combination of remote devices, remote networks, remote entities, etc. (individually and collectively referenced by reference number 1028). For example, communication interface 1024 may allow computer system 1000 to communicate with remote devices 1028 over communications path 1026, which may be wired and/or wireless, and which may include any combination of LANs, WANs, the Internet, etc. Control logic and/or data may be transmitted to and from computer system 1000 via communication path 1026.

In an aspect, a tangible apparatus or article of manufacture comprising a tangible computer useable or readable medium having control logic (software) stored thereon is also referred to herein as a computer program product or program storage device. This includes, but is not limited to, computer system 1000, main memory 1008, secondary memory 1010, and removable storage units 1018 and 1022, as well as tangible articles of manufacture embodying any combination of the foregoing. Such control logic, when executed by one or more data processing devices (such as computer system 1000), causes such data processing devices to operate as described herein.

Based on the teachings contained in this disclosure, it will be apparent to persons skilled in the relevant art(s) how to make and use the exemplary aspects using data processing devices, computer systems and/or computer architectures other than that shown in FIG. 10. In particular, aspects may operate with software, hardware, and/or operating system implementations other than those described herein.

Examples

Example 1 is a digital-to-analog conversion compensation method, comprising: adjusting a number of digital inputs signals to a digital-to-analog converter (DAC) from an odd number of digital input signals to an even number of digital input signals; converting, using the DAC, the even number of digital input signals to generate corresponding analog output signals; and compensating the analog output signals to compensate for the adjustment of the number of digital input signals to generate an odd number of analog output signals corresponding to the odd number of digital input signals.

Example 2 is the subject matter of Example 1, wherein: the adjusting comprises adding a digital offset value as an additional input to existing inputs of the DAC to provide the even number of digital input signals; and the compensating comprises removing an analog offset value from the analog output signals to generate the odd number of analog output signals.

Example 3 is the subject matter of Example 2, wherein the digital offset value and the analog offset value are fixed values.

Example 4 is the subject matter of Example 2, wherein the analog offset value corresponds to a digital value having an opposite magnitude than that of the digital offset value.

Example 5 is the subject matter of Example 2, wherein the analog offset value is an additive inverse of the digital offset value.

Example 6 is the subject matter of any of Examples 2-5, further comprising linearizing at least a subset of the even number of digital input signals to generate corresponding linearized digital input signals, wherein one or more of the analog output signals are generated based on corresponding ones of the linearized digital input signals.

Example 7 is the subject matter of any of Examples 2-5, wherein: the DAC comprises a linearizer that is configured to linearize a subset of the even number of digital input signals to generate corresponding linearized digital input signals; and wherein one or more of the analog output signals are generated based on corresponding ones of the linearized digital input signals.

Example 8 is a non-transitory computer readable medium comprising program instructions, when executed, causes a processor to perform the method of any of Examples 1-7.

Example 9 is a digital-to-analog conversion system, comprising: a digital-to-analog converter (DAC); digital offset generator that is configured to adjust a number of digital inputs signals to a digital-to-analog converter (DAC) from an odd number of digital input signals to an even number of digital input signals, wherein the DAC is configured to convert the even number of digital input signals to generate corresponding analog output signals; and an analog offset compensator that is configured to compensate the analog output signals to compensate for the adjustment of the number of digital input signals to generate an odd number of analog output signals corresponding to the odd number of digital input signals.

Example 10 is the subject matter of Example 9, wherein: the digital offset generator is configured to add a digital offset value as an additional input to existing inputs of the DAC to provide the even number of digital input signals; and the analog offset compensator is configured to remove an analog offset value from the analog output signals to generate the odd number of analog output signals.

Example 11 is the subject matter of Example 10, wherein the digital offset value and the analog offset value are fixed values.

Example 12 is the subject matter of Example 10, wherein the analog offset value corresponds to a digital value having an opposite magnitude than that of the digital offset value.

Example 13 is the subject matter of Example 10, wherein the analog offset value is an additive inverse of the digital offset value.

Example 14 is the subject matter of any of Examples 9-13, further comprising: a linearizer that is configured to linearize at least a subset of the even number of digital input signals to generate corresponding linearized digital input signals, wherein one or more of the analog output signals are generated based on corresponding ones of the linearized digital input signals.

Example 15 is the subject matter of any of Examples 9-13, wherein: the DAC comprises a linearizer that is configured to linearize a subset of the even number of digital input signals to generate corresponding linearized digital input signals; and wherein one or more of the analog output signals are generated based on corresponding ones of the linearized digital input signals.

Example 16 is a digital-to-analog converter (DAC), comprising: a converter that is configured to: receive a digital offset value and an odd number of digital inputs signals to the DAC; adjust the odd number of digital inputs signals based on the digital offset value to generate an even number of digital input signals; and convert the even number of digital input signals to generate corresponding analog output signals; and an analog offset compensator that is configured to compensate the analog output signals to generate an odd number of analog output signals corresponding to the odd number of digital input signals.

Example 17 is the subject matter of Example 16, further comprising: a digital offset generator that is configured to generate the digital offset value and provide the digital offset value to the converter.

Example 18 is the subject matter of Example 16, wherein the analog offset compensator is configured to remove an analog offset value from the analog output signals to compensate the analog output signals.

Example 19 is the subject matter of Example 17, wherein the analog offset compensator is configured to remove an analog offset value from the analog output signals to compensate the analog output signals.

Example 20 is the subject matter of any of Examples 16-19, wherein the converter is configured to add the digital offset value as an additional input to existing inputs of the DAC to adjust the odd number of digital inputs signals and generate the even number of digital input signals.

Example 21 is the subject matter of any of Examples 16-19, further comprising: a linearizer that is configured to linearize a subset of the even number of digital input signals to generate corresponding linearized digital input signals, wherein the converter is configured to generate the analog output signals based on the linearized digital input signals and a remainder of the even number of digital input signals.

Example 22 is the subject matter of any of Examples 18-21, wherein the analog offset value corresponds to a digital value having an opposite magnitude than that of the digital offset value.

Example 23 is a digital-to-analog conversion system comprising means for performing the method as claimed in any of claims 1-7.

Example 24 is a digital-to-analog converter (DAC), comprising: converting means for: receiving a digital offset value and an odd number of digital inputs signals to the DAC; adjusting the odd number of digital inputs signals based on the digital offset value to generate an even number of digital input signals; and converting the even number of digital input signals to generate corresponding analog output signals; and analog offset compensating means for compensating the analog output signals to generate an odd number of analog output signals corresponding to the odd number of digital input signals.

Example 25 is the subject matter of Example 24, further comprising: digital offset generating means for generating the digital offset value and provide the digital offset value to the converter.

Example 26 is the subject matter of any of Examples 24-25, wherein the analog offset compensating means removes an analog offset value from the analog output signals to compensate the analog output signals.

Example 27 is the subject matter of any of Examples 24-26, wherein the converting means adds the digital offset value as an additional input to existing inputs of the DAC to adjust the odd number of digital inputs signals and generate the even number of digital input signals.

Example 28 is the subject matter of any of Examples 24-27, further comprising: linearizering means for linearizing a subset of the even number of digital input signals to generate corresponding linearized digital input signals, wherein the converting means generates the analog output signals based on the linearized digital input signals and a remainder of the even number of digital input signals.

Example 29 is the subject matter of any of Examples 24-28, wherein the analog offset value corresponds to a digital value having an opposite magnitude than that of the digital offset value.

Example 30 is a method substantially as shown and described.

Example 31 is an apparatus substantially as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A digital-to-analog conversion compensation method, comprising:
adjusting a number of digital inputs signals to a digital-to-analog converter (DAC) from an odd number of digital input signals to an even number of digital input signals;
converting, using the DAC, the even number of digital input signals to generate corresponding analog output signals; and
compensating the analog output signals to compensate for the adjustment of the number of digital input signals to generate an odd number of analog output signals corresponding to the odd number of digital input signals.

2. The digital-to-analog conversion compensation method of claim 1, wherein:
the adjusting comprises adding a digital offset value as an additional input to existing inputs of the DAC to provide the even number of digital input signals; and
the compensating comprises removing an analog offset value from the analog output signals to generate the odd number of analog output signals.

3. The digital-to-analog conversion compensation method of claim 2, wherein the digital offset value and the analog offset value are fixed values.

4. The digital-to-analog conversion compensation method of claim 2, wherein the analog offset value corresponds to a digital value having an opposite magnitude than that of the digital offset value.

5. The digital-to-analog conversion compensation method of claim 2, wherein the analog offset value is an additive inverse of the digital offset value.

6. The digital-to-analog conversion compensation method of claim 2, further comprising linearizing at least a subset of the even number of digital input signals to generate corresponding linearized digital input signals, wherein one or more of the analog output signals are generated based on corresponding ones of the linearized digital input signals.

7. The digital-to-analog conversion compensation method of claim 2, wherein:
the DAC comprises a linearizer that is configured to linearize a subset of the even number of digital input signals to generate corresponding linearized digital input signals; and
wherein one or more of the analog output signals are generated based on corresponding ones of the linearized digital input signals.

8. A non-transitory computer readable medium comprising program instructions, when executed, causes a processor to perform the method of claim 1.

9. A digital-to-analog conversion system, comprising:
a digital-to-analog converter (DAC);
a digital offset generator that is configured to adjust a number of digital inputs signals to a digital-to-analog converter (DAC) from an odd number of digital input signals to an even number of digital input signals, wherein the DAC is configured to convert the even number of digital input signals to generate corresponding analog output signals; and
an analog offset compensator that is configured to compensate the analog output signals to compensate for the adjustment of the number of digital input signals to generate an odd number of analog output signals corresponding to the odd number of digital input signals.

10. The digital-to-analog conversion system of claim 9, wherein:
the digital offset generator is configured to add a digital offset value as an additional input to existing inputs of the DAC to provide the even number of digital input signals; and
the analog offset compensator is configured to remove an analog offset value from the analog output signals to generate the odd number of analog output signals.

11. The digital-to-analog conversion system of claim 10, wherein the digital offset value and the analog offset value are fixed values.

12. The digital-to-analog conversion system of claim 10, wherein the analog offset value corresponds to a digital value having an opposite magnitude than that of the digital offset value.

13. The digital-to-analog conversion system of claim 10, wherein the analog offset value is an additive inverse of the digital offset value.

14. The digital-to-analog conversion system of claim 9, further comprising:
a linearizer that is configured to linearize at least a subset of the even number of digital input signals to generate corresponding linearized digital input signals, wherein one or more of the analog output signals are generated based on corresponding ones of the linearized digital input signals.

15. The digital-to-analog conversion system of claim 9, wherein:
the DAC comprises a linearizer that is configured to linearize a subset of the even number of digital input signals to generate corresponding linearized digital input signals; and
wherein one or more of the analog output signals are generated based on corresponding ones of the linearized digital input signals.

16. A digital-to-analog converter (DAC), comprising:
a converter that is configured to:
receive a digital offset value and an odd number of digital inputs signals to the DAC;
adjust the odd number of digital inputs signals based on the digital offset value to generate an even number of digital input signals; and
convert the even number of digital input signals to generate corresponding analog output signals; and
an analog offset compensator that is configured to compensate the analog output signals to generate an odd number of analog output signals corresponding to the odd number of digital input signals.

17. The DAC of claim 16, further comprising:
a digital offset generator that is configured generate the digital offset value and provide the digital offset value to the converter.

18. The DAC of claim 17, wherein the analog offset compensator is configured to remove an analog offset value from the analog output signals to compensate the analog output signals.

19. The DAC of claim 16, wherein the analog offset compensator is configured to remove an analog offset value from the analog output signals to compensate the analog output signals.

20. The DAC of claim 19, wherein the analog offset value corresponds to a digital value having an opposite magnitude than that of the digital offset value.

21. The DAC of claim 16, wherein the converter is configured to add the digital offset value as an additional input to existing inputs of the DAC to adjust the odd number of digital inputs signals and generate the even number of digital input signals.

22. The DAC of claim 16, further comprising:
a linearizer that is configured to linearize a subset of the even number of digital input signals to generate corresponding linearized digital input signals, wherein the converter is configured to generate the analog output signals based on the linearized digital input signals and a remainder of the even number of digital input signals.

\* \* \* \* \*